US011595048B1

(12) United States Patent
Harush

(10) Patent No.: US 11,595,048 B1
(45) Date of Patent: Feb. 28, 2023

(54) FASTER PHASE-LOCKED LOOP LOCKING USING SUCCESSIVE APPROXIMATION TOWARD A TARGET FREQUENCY

(71) Applicant: Cypress Semiconductor Corporation, San Jose, CA (US)

(72) Inventor: Avri Harush, Herzeliya (IL)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/704,542

(22) Filed: Mar. 25, 2022

(51) Int. Cl.
*H03L 7/093* (2006.01)
*H03L 7/099* (2006.01)

(52) U.S. Cl.
CPC ............ *H03L 7/093* (2013.01); *H03L 7/0992* (2013.01)

(58) Field of Classification Search
CPC ............................... H03L 7/093; H03L 7/0992
See application file for complete search history.

(56) References Cited

U.S. PATENT DOCUMENTS

| | | | | |
|---|---|---|---|---|
| 7,271,634 B1 * | 9/2007 | Daga | ..................... | H03L 7/0818 327/158 |
| 8,432,204 B1 * | 4/2013 | Chern | ..................... | H03L 7/104 327/148 |
| 8,872,556 B1 * | 10/2014 | Chen | ..................... | H03L 7/103 327/156 |
| 10,097,187 B2 * | 10/2018 | Doare | ................... | H03L 7/0814 |
| 10,826,505 B1 * | 11/2020 | Moehlmann | ............ | H03L 7/087 |
| 2004/0041605 A1 * | 3/2004 | Kizer | ..................... | H03L 7/0805 327/159 |
| 2014/0347105 A1 * | 11/2014 | Rozenblit | ............... | H03L 7/183 327/156 |
| 2017/0288686 A1 * | 10/2017 | Gao | ..................... | H03L 7/0992 |
| 2020/0036383 A1 * | 1/2020 | Connell | ................... | H03B 5/06 |

FOREIGN PATENT DOCUMENTS

| | | | | |
|---|---|---|---|---|
| CN | 104506190 B | * | 3/2017 | ............ H03L 7/081 |
| EP | 0148525 B1 | | 5/1990 | |
| EP | 3327461 B1 | * | 11/2020 | ............ G01S 13/34 |
| EP | 3787187 A1 | * | 3/2021 | ............ H03L 7/081 |

\* cited by examiner

*Primary Examiner* — Adam D Houston

(57) ABSTRACT

A digital phase-locked loop (DPLL) includes a time-to-digital converter (TDC) to generate a multi-bit code based on a phase error between a reference clock and a feedback clock, a digital loop filter (DLF) coupled to the TDC, a digitally-controlled oscillator (DCO) circuit coupled to the DLF and to generate an output signal that is convertible to the feedback clock, and a logic component coupled to an input of the DCO circuit. The logic component is to: trigger, in response to detecting a power on of the DPLL circuit, a switch to decouple the DLF from the DCO circuit; determine, from the reference clock, a target frequency; measure a frequency of the feedback clock; and iteratively generate, based on the frequency during each iteration, a set of digital bits to the input of the DCO circuit that successively causes the frequency to converge towards the target frequency.

21 Claims, 5 Drawing Sheets

FASTER PHASE-LOCKED LOOP LOCKING USING SUCCESSIVE APPROXIMATION TOWARD A TARGET FREQUENCY

TECHNICAL FIELD

This disclosure relates to digital phase-locked loops, and more specifically, to faster phase-locked loop locking using successive approximation toward a target frequency.

BACKGROUND

A phase-locked loop (PLL) is a control system that generates an output signal whose phase is related to the phase of an input signal. There are several different types, but the simplest is an electronic circuit that includes a variable frequency oscillator and a phase detector in a feedback loop. The oscillator generates a periodic signal, and the phase detector compares the phase of that signal with the phase of the input periodic signal, adjusting the oscillator to keep the phases matched. Thus, the PLL operates on two inputs that can be understood as an input reference clock and a feedback clock. Part of the function of the PLL is to approximate the delay between these two inputs in order to make matching adjustments, until the output "locks" onto the frequency and phase of the input reference clock.

In certain digital PLLs (DPLLs), a digitally-controlled oscillator (DCO) is described as a code-to-frequency circuit, where for each input code, there is a unique output frequency. The time that it takes the DCO of a DPLL to lock onto the frequency/phase of the reference clock is referred to as locking time. The DPLL typically undergoes a number of iterations through a loop of the DPLL in order for the DCO to ultimately perform this lock. In certain systems-on-a-chip (SoCs), the circuitry is designed with a relatively long sleep mode and quick active mode, which functions only for a short time such as in sensors, alarm actuators, or the like, but are otherwise idle. Thus, current SoC designs that include a DPLL endeavor to quickly lock onto the reference frequency and phase to reduce the power-hungry active mode of the SoC.

DETAILED DESCRIPTION

The following description sets forth numerous specific details such as examples of specific systems, components, methods, and so forth, in order to provide a good understanding of various embodiments of a digital phase-locked loop (DPLL) described herein. Such DPLLs may be employed in memory control units in different types of transportation vehicles or in any number of other applications such as home automation and security. It will be apparent to one skilled in the art, however, that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Figure 1:
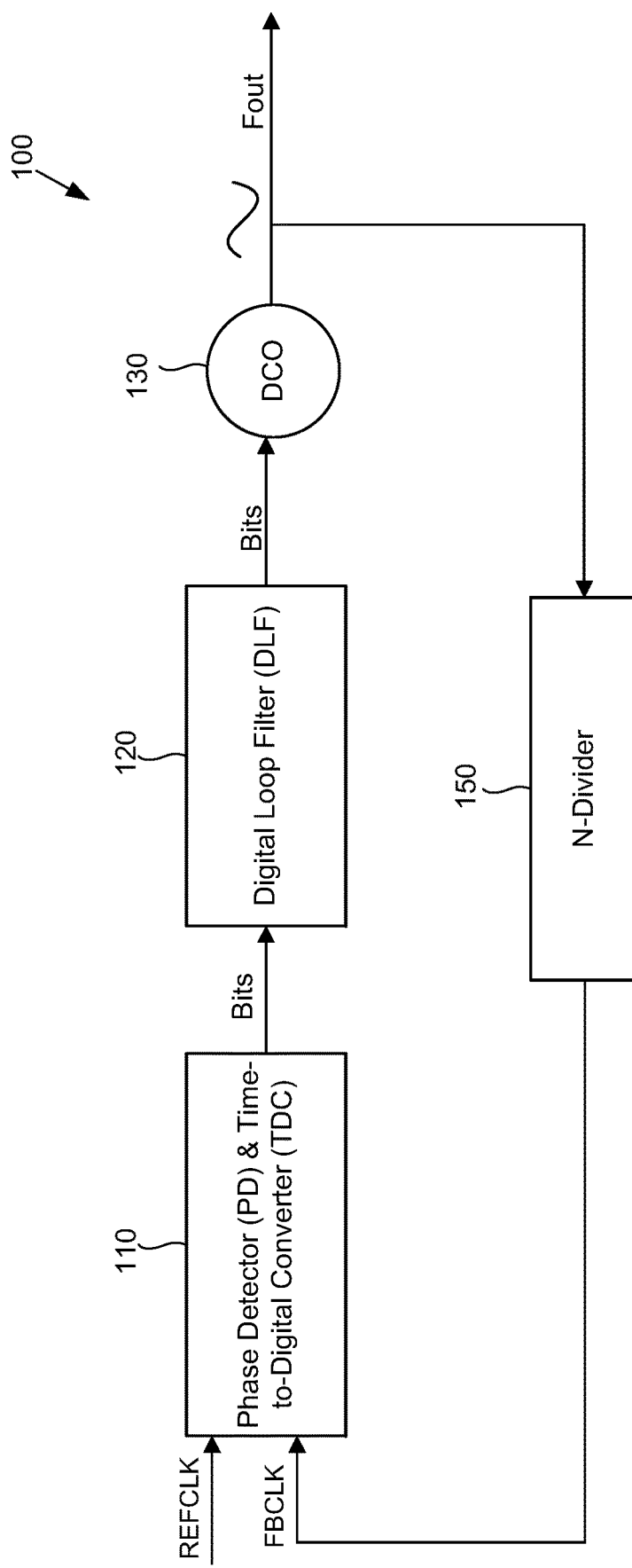
FIG. 1 is a simplified block diagram of a digital phase-locked loop (DPLL) employed in certain electronic devices.

FIG. 1 is a simplified block diagram of a digital phase-locked loop (DPLL) 100 employed in certain electronic devices. In some cases, the DPLL 100 includes a phase detector (PD) and time-to-digital converter (TDC) 110, a digital loop filter (DLF) 120, a digitally-controlled oscillator (DCO) 130, and a frequency divider 150, generally coupled together in a loop, as illustrated. In such DPLL 100, the PD (of the PD & TDC 110) is adapted to detect a phase and frequency of an input reference clock (REFCLCK) and a feedback clock (FBCLK). Further, in the DPLL 100, the TDC of the PD & TDC 110 is configured to determine a time difference (e.g., a phase error) between the reference frequency (Fref) of the input reference clock and the feedback frequency (Fb) of the feedback clock.

The TDC of the PD & TDC 110 generates a multi-bit code that digitally encodes the time difference (e.g., quantifies the phase error) and is designed to trigger the DCO 130 to adjust an output frequency (Fout) of an alternating-current (AC) output signal of the DPLL 100. The DCO 130 of DPLLs is generally implemented as a code-to-frequency circuit, where for each input code (e.g., set of digital bits), there is a unique output frequency if the DCO 130. The DLF 120, which is coupled between the TDC and the DCO 130, is configured to digitally filter the multi-bit code to ensure accurate delivery of the individual bits of the multi-bit code to the DCO 130.

In various applications, the DPLL 100 may be employed in battery-powered consumer electronics, lower-power wireless sensors, home automation systems, remote controls, and automotive memory control units (MCUs), for example, where low cost, low power, less board of materials (BOM), and smaller size are highly desired. The DLF 120 is generally implemented as an on-chip integrated loop filter to further keep the design smaller than analog counterparts. The frequency divider 150 divides the output frequency of the AC output signal by an integer value (N) in order to generate the feedback clock that flows back into the PD & TDC 110. The DPLL 100 is thus designed to operate in a feedback loop in which the time difference between the input reference clock and the feedback clock is minimized until "locking" onto the frequency and phase of the input reference clock.

In many applications of DPLLs, the time that it takes the DCO 130 to lock onto the frequency/phase of the reference clock is referred to as locking time. The DPLL 100 typically undergoes a number of iterations through a loop of the DPLL 100 in order for the DCO 130 to ultimately perform this lock. In certain systems-on-a-chip (SoCs), the circuitry is designed with a relatively long sleep mode and quick active mode, for example, that function only for a short time such as in sensors, alarm actuators, MCUs, or the like, but are otherwise idle. Thus, current SoC designs that include a DPLL endeavor to quickly lock onto the reference frequency and phase to reduce the power-hungry active mode of the SoC. Current designs of the DPLL 100, however, react relatively slowly to waking due to locking times that do not meet stricter standards that seek to reduce power consumption required for locking onto both frequency and phase of the input reference clock.

Figure 2:
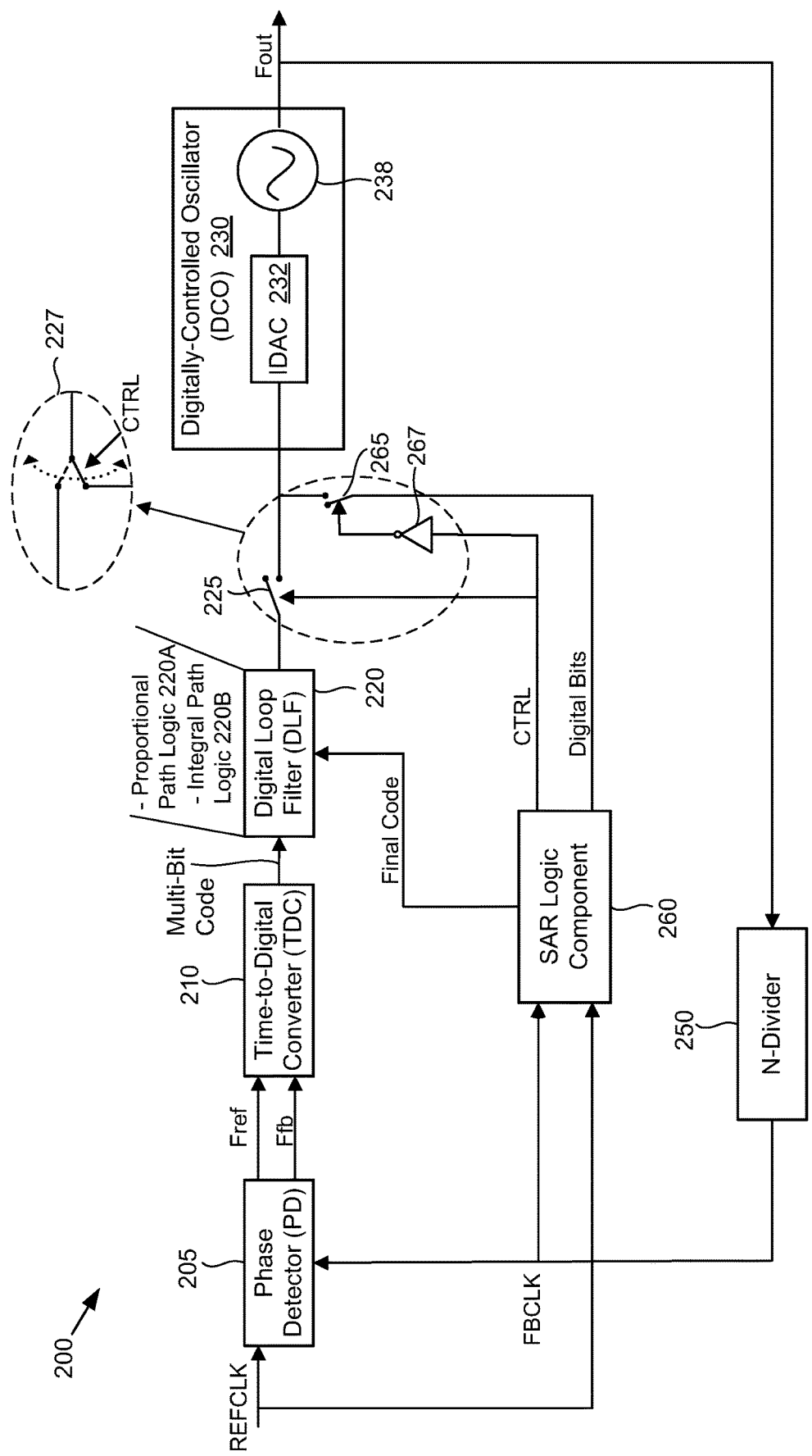
FIG. 2 is a more-detailed block diagram of a DPLL in accordance with at least some embodiments.

FIG. 2 is a more-detailed block diagram of a digital PLL (or DPLL 200) in accordance with at least some embodiments, which is designed to resolve the deficiencies of certain DPLLs that were discussed with reference to FIG. 1. The DPLL 200, in various embodiments, may be a DPLL circuit, a DPLL device, or a DPLL apparatus. The DPLL 200, for example, may include a phase detector (PD) 205, a time-to-digital converter (TDC) 210 coupled to the PD 205, a digital loop filter (DLF) 220 coupled to the TDC 210, a digitally-controlled oscillator (DCO) circuit 230 coupled to the DLF 220, and a frequency divider 250 coupled between an output of the DCO circuit 230 and the PD 205, all of which are digital components, except the DCO circuit 230 which may include some analog components. In at least some embodiments, the DPLL 200 further includes a logic component 260 adapted to perform successive approximation within a modified loop of the DPLL 200 in order more quickly converge on a target frequency, as will be described in detail. Thus, the logic component 260 may be a successive approximation register (SAR) logic component 260, for example.

In these embodiments, the PD 205 is configured to detect a phase and frequency of an input reference clock (REFCLCK) and a feedback clock (FBCLK), e.g., so as to be able to provide the reference frequency (Fref) and phase of the input reference clock and the feedback frequency (Ffb) and phase of the feedback clock to the TDC 210. Further, the TDC 210 is configured to determine a time difference (e.g., a phase error) between the reference frequency (Fref) of the input reference clock and the feedback frequency (Fb) of the feedback clock. According to these embodiments, the TDC 210 then generates a multi-bit code that digitally encodes the time difference (e.g., phase error) and is designed to trigger the DCO circuit 230 to adjust an output frequency (Fout) of an alternating-current (AC) output signal of the DPLL 200. The DCO circuit 230 is configured to generate an output signal that is convertible to the feedback clock, e.g., via the frequency divider 250. For example, the feedback divider 250 may generate the feedback clock by reducing a frequency of the output signal of the DCO circuit 230 by an integer value (e.g., N).

In at least some embodiments, the DLF 220 is configured to digitally filter the multi-bit code from the TDC to generate a filtered multi-bit code, e.g., that has accurate bits capable of accurately driving the DCO circuit 230. The DLF 220, for example, may include proportional path logic 220A having a first gain and integral path logic 220B having a second gain. In some embodiments, the DLF 220 implements a z-domain transfer function to process a combination of a proportional part of the multi-bit code multiplied by the first gain and an integral part of the multi-bit code multiplied by the second gain. The proportional path logic 220A and the integral path logic 220B may both be instantiated in an on-chip integrated loop filter of the DPLL 200.

In at least some embodiments, and to overcome the deficiencies of previous designs, the DPLL 200 further includes the SAR logic component 260 that is configured to control the DPLL 200 in a frequency stage, which causes an ultra-fast search for a target frequency using successive approximation, followed by a standard phase stage in which the phase and frequency of the input reference clock is finally locked at the output signal (Fout) of the DCO 230. Before the start of the phase stage of operation, the logic component 260 generates initial values of a set of digital bits for the multi-bit code normally generated by the TDC 210 and provides this set of digital bits to the DLF 220 as a starting point for performing the phase and frequency locking during the phase stage. By providing the initial digital bits to the DLF 220 in lieu of the relatively random bits received from the TDC 210 at the start of operation, locking time is significantly reduced. Further, in these embodiments, the DCO circuit 230 includes a multi-bit current digital-to-analog converter (IDAC) 232 coupled to a ring oscillator 238. For example, the IDAC 232 may convert either a filtered multi-bit code received from the DLF 220 (phase stage) or the set of digital bits (frequency stage) to a current that is supplied to the ring oscillator 238. The ring oscillator 238 generates AC output signal (Fout) of the DPLL 200 that corresponds to the received current.

With additional specificity, in some embodiments of the frequency stage, the logic component 260 receives the input reference clock (REFCLK) and the feedback clock (FBCLK) and is selectively coupled to the DCO circuit 230 in a way that removes the PD 205, the TDC 210, and the DLF 220 from loop operation during the frequency stage. For example, to implement the selective coupling, the DPLL 200 may further include a first switch 225 positioned between the DLF 220 and the DCO circuit 230, and a second switch 265 position between the logic component 260 and an input to the DCO 230. An inverter 267 may be positioned between the logic component 260 and the second switch 265 so that a control signal to open the first switch 225 will close the second switch 265 and vice versa. In another embodiment, a single switch 227 is employed instead of a pair of single switches, such that the control signal will switch coupling with the DCO circuit 230 from the DLF 220 to the logic component 260.

In various embodiments, when the DPLL 200 is powered on (or awakened), the logic component 260 initially takes control during the frequency stage of operation. During the frequency stage, for example, the logic component may trigger a switch to decouple the DLF 220 from the DCO circuit 230. This decoupling may be triggered, for example, in response to detecting a power on of the DPLL 200, e.g., due to being woken up or initial power up of the DPLL 200. To do so, in one embodiment, the logic component 260 triggers the first switch 225 to be opened, which triggers the second switch 265 to be closed via the inverter 267. In another embodiments, the logic component 260 triggers the single switch 227 to decouple the DCO circuit 230 from the DLF 220 while coupling the DCO circuit 230 to the logic component 260. Further, during the frequency stage, the logic component 260 may determine, from the reference clock, a target frequency and measure a frequency of the feedback clock. To do so, the logic component 260 may include an integrated phase detector similar to the PD 205, for example. The logic component 260 may further iteratively generate, based on the frequency of the feedback clock during each iteration, a set of digital bits to the input of the DCO circuit 230 that successively causes the frequency of the feedback clock to converge towards the target frequency.

In at least some embodiments, to perform the successive approximation, the logic component 260, in each successive iteration, divides, by half, a change in the frequency of the feedback clock from a previous iteration to generate an updated frequency. The logic component 260 then encodes, in the set of digital bits, the updated frequency.

In at least some embodiments, to determine when to stop performing the successive approximation iterations, the logic component 260 further detects the frequency of the feedback clock satisfy a threshold percentage of the target frequency (e.g., 90%, 95%, 97%, 99%, 99.5%, or the like) or detects completion of a fixed number of iterations known to cause the DPLL 200 to satisfy a particular threshold percentage of the target frequency (e.g., deemed sufficiently converged onto the target frequency). In response to determining it is time to stop performing the successive approximation iterations, the logic component 260 may further provide a final code to the DLF, the final code including the set of digital bits generated during a final iteration when the threshold percentage of the frequency is satisfied and/or the fixed number of iterations is satisfied. The logic component 260 may further trigger the switch (e.g., the first switch 225 or the single switch 227) to recouple the DLF 220 and the DCO circuit 230, e.g., or otherwise causing the DLF 220 to be recoupled to the DCO circuit 230. The logic component 260 can further either discontinue operation of the SAR loop iterations of the logic component 260 (e.g., discontinuing operation of the iteratively generating the set of digital bits) or decouple the logic component 260 from the DCO circuit 230, e.g., so that the standard phase locking loop of the DPLL 200 may proceed.

In these embodiments, to begin the phase stage, the DLF 220 may use the final code received from the logic component 260 in initial filtering, as the DPLL 200 begins to finalize a phase and frequency lock relative to the reference clock. In other words, the initial set of digital bits on which the DLF 220 performs digital filter processing starting with this final code that resulted from the SAR loop iterations of the frequency stage. In this way, the DPLL 200 begins the standard phase stage, which includes phase and frequency loop iterations to lock in the phase and frequency of the reference clock, with a multi-bit code that more closely correlates to the input reference frequency. Obtaining a lock of the input frequency thus happens much quicker and the phase lock can also more quickly be concurrently obtained.

In various embodiments, the logic component 260 is dedicated logic instantiated on a chip that holds the DPLL 200. This chip, as discussed, may be an SoC in one embodiment. In some embodiments, the logic component 260 is a Field Programmable Gate Array (FPGA), an application-specific integrated circuit (ASIC) or ASIC-like circuitry, or other programmable microprocessor, processor, or processing logic. In these embodiments, the logic component 260 and optionally other of the digital components of the DPLL 200 may be implemented using register-transfer level (RTL) digital logic and hardware that provides a compact design.

Figure 3:
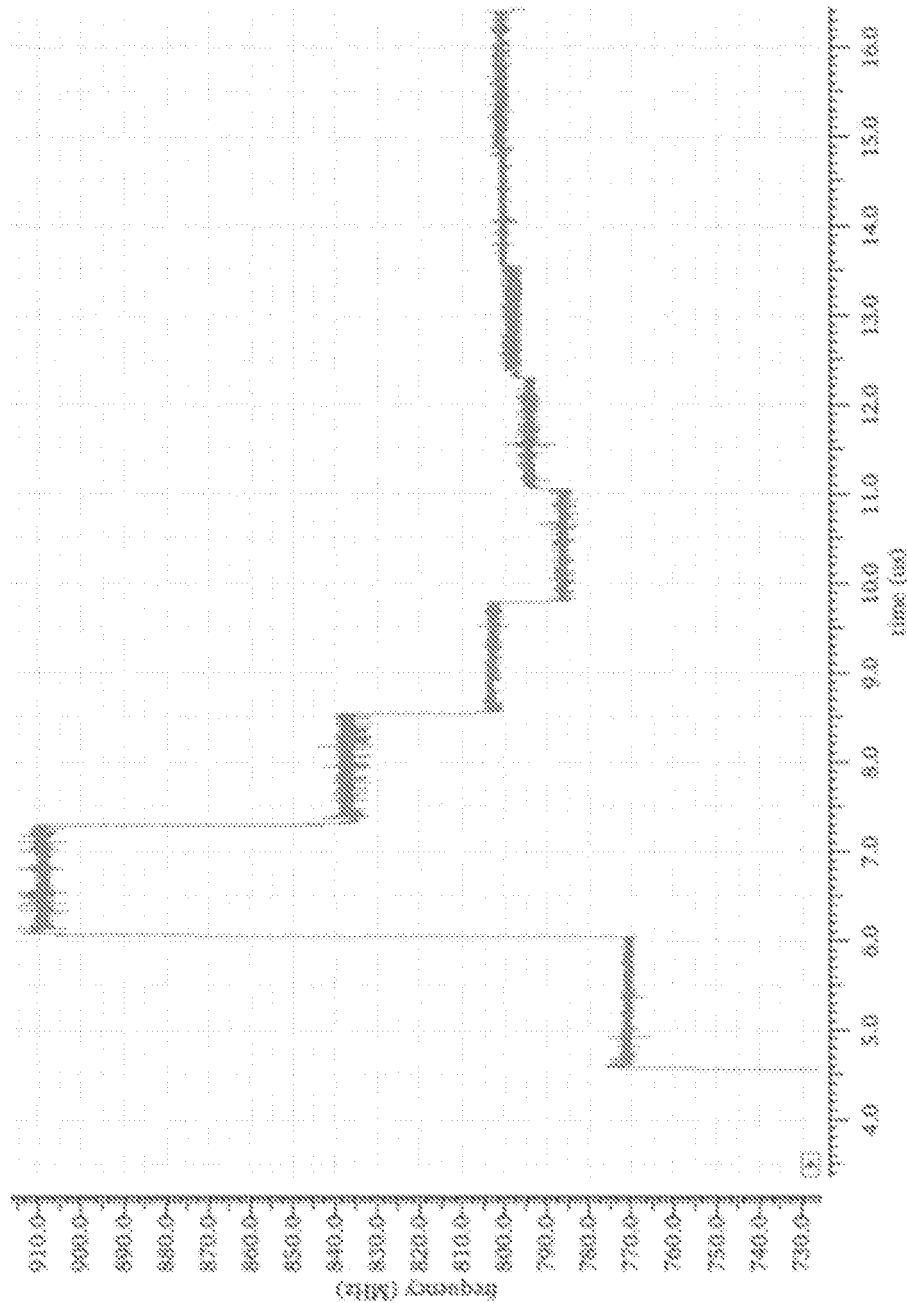
FIG. 3 is a graph of an output of the DPLL of FIG. 2 during a frequency phase that quickly converges onto a target frequency in accordance with at least some embodiments.

FIG. 3 is a graph of an output of the DPLL 200 of FIG. 2 during a frequency phase that quickly converges onto a target frequency in accordance with at least some embodiments. Thus, the graph of FIG. 3 illustrates the output frequency (Fout) of the DPLL 200 as a result of a number of SAR loop iterations that successively (and quickly) converge on a target frequency. As can be noted, only by way of example, the target frequency in the graph is 800 megahertz (MHz). The second iteration is not fully illustrated, but results in a jump up to 770 MHz, followed by a jump to 910 MHz. Once the SAR iterations pass the target frequency, and thus has resolved a direction to reach the target frequency, the SAR algorithm executed by the logic component 260 divides the previous change in frequency by half before going through the next iteration. Thus, the subsequent iterations quickly half the distance to the target frequency. In this example, therefore, after about 7-8 iterations, the output frequency is well over 90% of the target frequency, and the SAR operation of the logic component 260 can terminate, e.g., transition to the standard phase stage of operation. Perhaps, in some embodiments, even fewer iterations (e.g., 5-6 iterations) may also be sufficient, e.g., to satisfy the threshold percentage of the target frequency desired before this transition.

Figure 4:
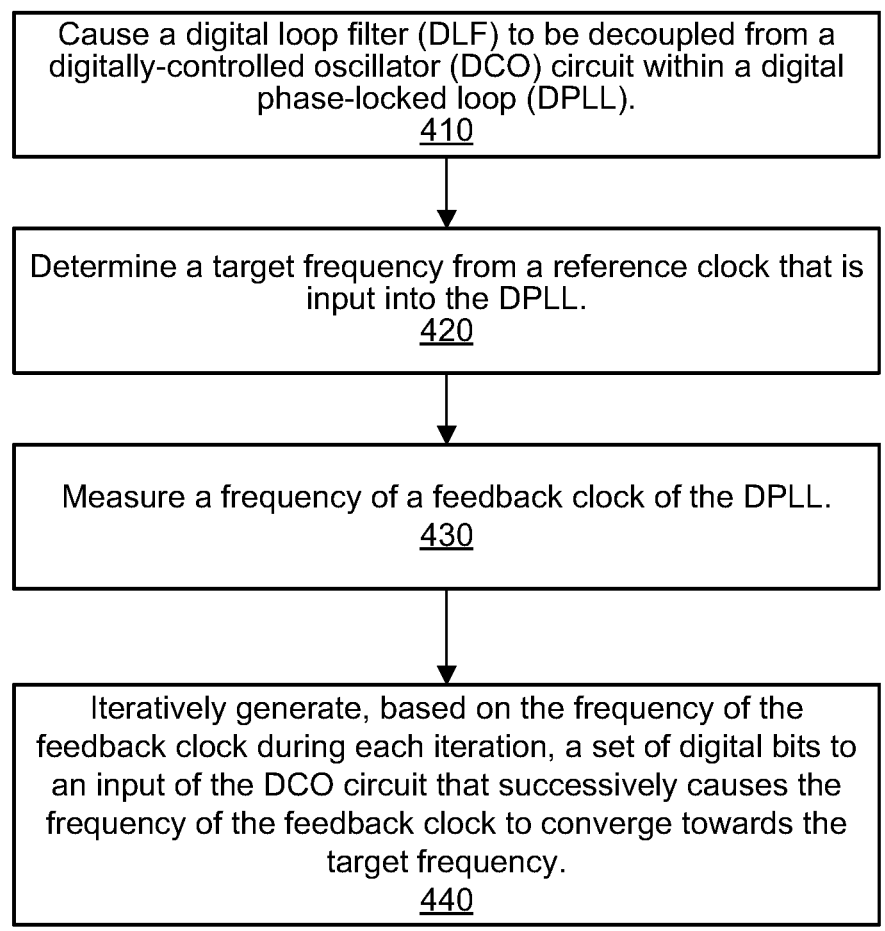
FIG. 4 is a flow diagram of method that executable by a logic component that, in part, performs successive approximation of a set of digital bits that cause a digitally-controlled oscillator (DCO) circuit of the DPLL to iteratively converge on the target frequency in accordance with at least some embodiments.

FIG. 4 is a flow diagram of method 400 that executable by a logic component that, in part, performs successive approximation of a set of digital bits that cause the DCO circuit 230 of the DPLL 200 to iteratively converge on the target frequency in accordance with at least some embodiments. Thus, in these embodiments, the method 400 is performed by the DPLL 200, and particularly the logic component 260, of FIG. 2. The operations need not be performed in a specific order, unless explicitly disclosed to be required to be performed in such an order.

At operation 410, the method 400 includes causing a digital loop filter (DLF) to be decoupled from a digitally-controlled oscillator (DCO) circuit, e.g., the DCO circuit 230, within a digital phase-locked loop (DPLL) circuit such as the DPLL 200. Operation 410 may be in response to detecting a power on of the DPLL. The method 400 is also applicable to a DPLL device or a DPLL apparatus.

At operation 420, the method 400 further includes determining a target frequency from a reference clock that is input into the DPLL circuit.

At operation 430, the method 400 further includes measuring a frequency of a feedback clock of the DPLL circuit.

At operation 440, the method 400 further includes iteratively generating, based on the frequency of the feedback clock during each iteration, a set of digital bits to an input of the DCO circuit 230 that successively causes the frequency of the feedback clock to converge towards the target frequency.

Figure 5:
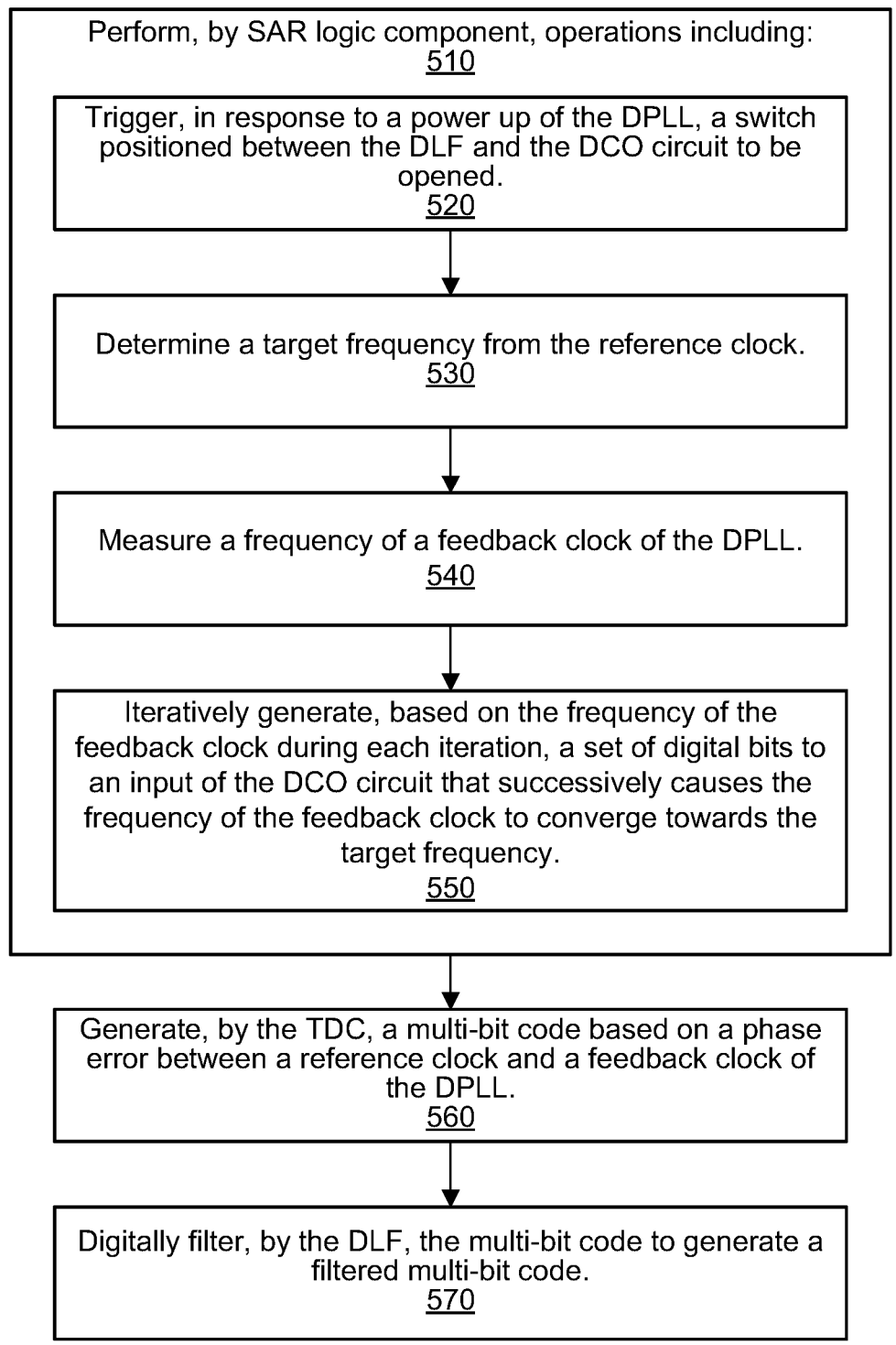
FIG. 5 is a flow diagram of a method of operating a digital PLL (DPLL) according to at least one embodiment.

FIG. 5 is a flow diagram of a method 500 of operating a digital PLL (DPLL) according to at least one embodiment. In these embodiments, the method 400 is performed by the DPLL 200 of FIG. 2. The operations need not be performed in a specific order, unless explicitly disclosed to be required to be performed in such an order.

At operation 510, the method 500 includes generating, by the TDC 210, a multi-bit code based on a phase error between a reference clock and a feedback clock of a digital phase-locked loop (DPLL) circuit such as the DPLL 200. The method 500 is also applicable to an DPLL device or DPLL apparatus.

At operation 520, the method 500 further includes digitally filtering, by the DLF 220, the multi-bit code to generate a filtered multi-bit code.

At operation 530, the method 500 further includes performing, by the SAR logic component 260, a set of operations 540 through 570.

At operation 540, the method 500 further includes triggering, in response to detecting a power on of the DPLL circuit, a switch to decouple the DLF 220 from the DCO circuit 230.

At operation 550, the method 500 further includes determining, from the reference clock, a target frequency.

At operation 560, the method 500 further includes measuring a frequency of the feedback clock.

At operation 570, the method 500 further includes iteratively generating, based on the frequency of the feedback clock during each iteration, a set of digital bits to an input of the DCO circuit 230 that successively causes the frequency of the feedback clock to converge towards the target frequency. This iteratively generating can be terminated upon detecting the frequency of the feedback clock satisfy a threshold percentage of the target frequency and/or a fixed number of iterations.

Various embodiments of the AC-DC flyback converter described herein may include various operations. These operations may be performed and/or controlled by hardware components, digital hardware and/or firmware, and/or combinations thereof. As used herein, the term "coupled to" may mean connected directly to or connected indirectly through one or more intervening components. Any of the signals provided over various on-die buses may be time multiplexed with other signals and provided over one or more common on-die buses. Additionally, the interconnection between circuit components or blocks may be shown as buses or as single signal lines. Each of the buses may alternatively be one or more single signal lines and each of the single signal lines may alternatively be buses.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for USB-C mode-transition architecture described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A digital phase-locked loop (DPLL) circuit comprising:
   a time-to-digital converter (TDC) to generate a multi-bit code based on a phase error between a reference clock and a feedback clock of the DPLL circuit;
   a digital loop filter (DLF) coupled to the TDC;
   a digitally-controlled oscillator (DCO) circuit coupled to the DLF and to generate an output signal that is convertible to the feedback clock; and
   a logic component coupled between an input and an output of the DPLL circuit and coupled to an input of the DCO circuit, the logic component to:
      trigger, in response to detecting a power on of the DPLL circuit, a switch to decouple the DLF from the DCO circuit;
      determine, from the reference clock, a target frequency;
      measure a frequency of the feedback clock; and
      iteratively generate, based on the frequency of the feedback clock during each iteration, a set of digital bits to the input of the DCO circuit that successively causes the frequency of the feedback clock to converge towards the target frequency.

2. The DPLL circuit of claim 1, further comprising a feedback divider to generate the feedback clock by reducing a frequency of an output of the DCO circuit by an integer value.

3. The DPLL circuit of claim 1, wherein the logic component is further to, in each successive iteration:
   divide, by half, a change in the frequency of the feedback clock from a previous iteration to generate an updated frequency; and
   encode, in the set of digital bits, the updated frequency.

4. The DPLL circuit of claim 1, wherein the logic component is further to:
   detect the frequency satisfy a threshold percentage of the target frequency;
   provide a final code to the DLF, the final code comprising the set of digital bits generated during a final iteration when the threshold percentage of the frequency is satisfied;
   trigger the switch to recouple the DLF and the DCO circuit; and
   one of discontinue operation of the logic component or decouple the logic component from the DCO circuit.

5. The DPLL circuit of claim 4, wherein the DLF is to use the final code received from the logic component in initial filtering, as the DPLL circuit begins to finalize a phase and frequency lock relative to the reference clock.

6. The DPLL circuit of claim 1, wherein the logic component is further to:
   detect completion of a fixed number of iterations;
   provide a final code to the DLF, the final code comprising the set of digital bits generated during a final iteration of the fixed number of iterations;
   trigger the switch to recouple the DLF and the DCO circuit; and
   one of discontinue operation of the logic component or decouple the logic component from the DCO circuit.

7. The DPLL circuit of claim 6, wherein the DLF is to use the final code received from the logic component in initial filtering, as the DPLL circuit begins to finalize a phase and frequency lock relative to the reference clock.

8. The DPLL circuit of claim 1, wherein the DCO circuit comprises a multi-bit current digital-to-analog converter (IDAC).

9. A method comprising:
causing, in response to detecting a power on of a digital phase-locked loop (DPLL) circuit, a digital loop filter (DLF) to be decoupled from a digitally-controlled oscillator (DCO) circuit of the DPLL circuit;
determining a target frequency from a reference clock that is input into the DPLL circuit;
measuring a frequency of a feedback clock of the DPLL circuit; and
iteratively generating, based on the frequency of the feedback clock during each iteration, a set of digital bits to an input of the DCO circuit that successively causes the frequency of the feedback clock to converge towards the target frequency.

10. The method of claim 9, further comprising generating the feedback clock by dividing a frequency of an output of the DCO circuit by an integer value.

11. The method of claim 9, further comprising, in each successive iteration:
dividing, by half, a change in the frequency of the feedback clock from a previous iteration to generate an updated frequency; and
encoding, in the set of digital bits, the updated frequency.

12. The method of claim 9, further comprising:
detecting the frequency satisfy a threshold percentage of the target frequency;
providing a final code to the DLF, the final code comprising the set of digital bits generated during a final iteration when the threshold percentage of the frequency is satisfied;
causing the DLF to be recoupled to the DCO circuit; and
discontinuing operation of the iteratively generating.

13. The method of claim 12, further comprising using, by the DLF, the final code in initial filtering, as the DPLL circuit begins to finalize a phase and frequency lock relative to the reference clock.

14. The method of claim 9, further comprising:
detecting completion of a fixed number of iterations;
providing a final code to the DLF, the final code comprising the set of digital bits generated during a final iteration of the fixed number of iterations;
causing the DLF to be recoupled to the DCO circuit; and
discontinuing operation of the iteratively generating.

15. The method of claim 14, further comprising using, by the DLF, the final code in initial filtering, as the DPLL circuit begins to finalize a phase and frequency lock relative to the reference clock.

16. The method of claim 9, wherein the DCO circuit comprises a multi-bit current digital-to-analog converter (IDAC).

17. A method of operating a digital phase-locked loop (DPLL) circuit comprising a time-to-digital converter (TDC), a digital loop filter (DLF) coupled to the TDC, a digitally-controlled oscillator (DCO) circuit coupled to the DLF, and a successive approximation (SAR) logic component coupled between the DCO circuit and an input of the DPLL circuit, the method of operating the DPLL circuit comprising:

generating, by the TDC, a multi-bit code based on a phase error between a reference clock and a feedback clock of the DPLL circuit;
digitally filtering, by the DLF, the multi-bit code to generate a filtered multi-bit code; and
performing, by the SAR logic component, a plurality of operations comprising:
triggering, in response to detecting a power on of the DPLL circuit, a switch to decouple the DLF from the DCO circuit;
determining, from the reference clock, a target frequency;
measuring a frequency of the feedback clock; and
iteratively generating, based on the frequency of the feedback clock during each iteration, a set of digital bits to an input of the DCO circuit that successively causes the frequency of the feedback clock to converge towards the target frequency.

18. The method of claim 17, wherein the DPLL circuit further comprises a frequency divider, the method further comprising generating the feedback clock by dividing, by the frequency divider, a frequency of an output of the DCO circuit by an integer value.

19. The method of claim 17, wherein the plurality of operations further comprise, in each successive iteration:
dividing, by half, a change in the frequency of the feedback clock from a previous iteration to generate an updated frequency; and
encoding, in the set of digital bits, the updated frequency.

20. The method of claim 17, wherein the plurality of operations further comprise:
detecting the frequency satisfy a threshold percentage of the target frequency;
providing a final code to the DLF, the final code comprising the set of digital bits generated during a final iteration when the threshold percentage of the frequency is satisfied;
triggering the switch to recoupled the DLF and the DCO circuit; and
one of discontinuing operation of the SAR logic component or decoupling the SAR logic component from the DCO circuit; and
wherein the method further comprises using, by the DLF, the final code received from the logic component in initial filtering, as the DPLL circuit begins to finalize a phase and frequency lock relative to the reference clock.

21. The method of claim 17, wherein the plurality of operations further comprise:
detecting completion of a fixed number of iterations;
providing a final code to the DLF, the final code comprising the set of digital bits generated during a final iteration of the fixed number of iterations;
triggering the switch to recouple the DLF and the DCO circuit; and
one of discontinuing operation of the SAR logic component or decoupling the SAR logic component from the DCO circuit; and
wherein the method further comprises using, by the DLF, the final code received from the logic component in initial filtering, as the DPLL circuit begins to finalize a phase and frequency lock relative to the reference clock.

* * * * *